PULSE GENERATOR

Filed June 28, 1968 3 Sheets-Sheet 1

INVENTOR
ROGER B. RUSSELL, JR.
BY
Burd, MacEachron, Braddock, Bartz & Schwartz
ATTORNEYS INVENTOR.
ROGER B. RUSSELL, JR.
BY
Burd, MacEachron, Braddock, Bartz & Schwartz
ATTORNEYS April 21, 1970 R. B. RUSSELL, JR 3,508,167

PULSE GENERATOR

Filed June 28, 1968 3 Sheets-Sheet 3

INVENTOR.
ROGER B. RUSSELL, JR.
BY
Burd, MacEachron, Braddock, Bartz & Schwartz
ATTORNEYS United States Patent Office 3,508,167
Patented Apr. 21, 1970

3,508,167
PULSE GENERATOR

Roger B. Russell, Jr., Thousand Oaks, Calif., assignor to Mennen-Greatbatch Electronics, Inc., Clarence, N.Y., a corporation of New York Filed June 28, 1968, Ser. No. 740,910
Int. Cl. H03k *3/26*
U.S. Cl. 331—111 17 Claims

ABSTRACT OF THE DISCLOSURE

A semiconductor pulse generator having a pulse width and pulse repetition rate which are relatively independent of load and supply voltage. The semiconductor elements are relegated to switching functions so that timing is substantially independent of transistor gain characteristics. The pulse generator includes a shunt circuit which provides a preferred current path for operating the pulse timer to decrease the effect of transistor characteristics on pulse timing and a variable reference voltage circuit which makes pulse timing substantially independent of wide fluctuations in source voltage.

BACKGROUND OF THE INVENTION

This invention relates to electronic apparatus and more particularly to semiconductor pulse generators. Electronic pulse generators are well known. Most represent a design compromise between simplicity and stability. Simplicity of design is desirable to reduce costs and to improve reliability, but the elimination of power supply regulators and of isolation stages necessarily sacrifices some degree of stability.

One prior art circuit is disclosed in the G.E. Transistor Manual, Seventh Edition, page 379, Fig. 15.9. That device is designed for use as a metronome. The circuitry is simple, but stability is a major problem because the timing capacitor discharges through the base-emitter junction of the timing transistor. Any variation in the parameters of that junction adversely affects the stability of pulse timing. Normal parameter variations from one transistor to another also make that circuit difficult to produce in quantity with high accuracy. In addition, in that circuit, switch-off occurs far out on the tail of the capacitor discharge curve thereby making pulse length a strong function of transistor parameters, particularly the product of the current gains of the two transistors. If the product of the current gains is too high, the circuit never turns off.

SUMMARY OF THE INVENTION

The pulse generator of the invention provides a simple, yet highly stable pulse generator. It overcomes the disadvantages of the prior art structures by relegating transistors to switching functions thereby reducing the effect of transistor characteristics on pulse width and repetition rate. A by-pass or shunt path containing one or more diodes is connected so that timing capacitor charge and discharge currents flow occurs through circuits which do not include the base-emitter junction of a timing transistor. The pulse generator of the invention preferably includes a variable reference potential connected to the transistor switches and to the timing capacitor to cause turn-off of the switches at an early point on the capacitor discharge curve and to provide a variable reference voltage which is a function of supply voltage. In this manner, turn off of the transistors to end each pulse occurs as a function of a voltage ratio rather than of an absolute voltage. The pulse generator of the invention turns off even though the product of the current gains of the two switching transistors approaches infinity.

DESCRIPTION OF THE PREFERRED EMBODIMENTS

In all of the figures, equivalent parts are numbered with the same number. Slightly modified parts performing similar functions are numbered with numerals which differ by multiples of 100.

Figure 1:
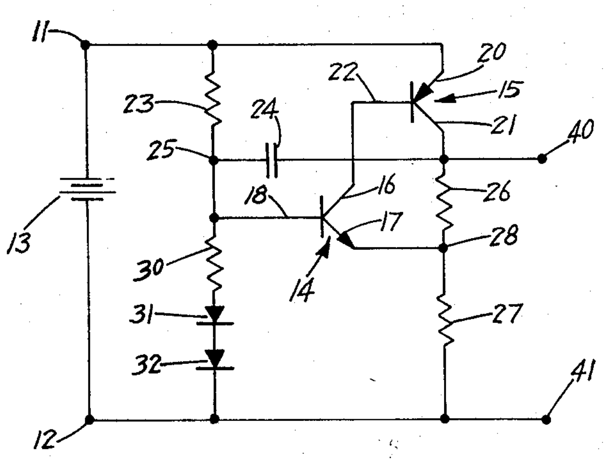
FIG. 1 is a schematic circuit diagram of a simple embodiment of the pulse generator of the invention.

Referring now to FIGURE 1, a pair of power input terminals 11 and 12 are connected across a power source, here shown as a battery 13. A pair of electronic switches are here shown as transistors 14 and 15. Transistor 14 includes a pair of current carrying electrodes, such as collector 16 and emitter 17, and a control electrode here shown as base 18. Transistor 15 also includes a pair of current carrying electrodes, such as emitter 20 and collector 21, and a control electrode, here shown as base 22. Collector 16 is directly connected to base 22. Emitter 20 is directly connected to power input terminal 11.

The pulse generator includes a timing circuit with a resistor 23 connected serially to a capacitor 24, between power input terminal 11 and collector 21. A point 25, intermediate resistor 23 and capacitor 24 is connected to base 18.

A variable voltage reference, here shown as voltage divider including resistors 26 and 27 is connected between collector 21 and power input terminal 12. A point 28, intermediate resistors 26 and 27, is directly connected to emitter 17. A bypass or shunt path for operation of timing capacitor 24 includes a serial combination of a resistor 30, and diodes 31 and 32 connected between point 25 and power input terminal 12. A first output terminal 40 is connected to collector 21, and a second output terminal 41 is connected to power input terminal 12.

In operation, as soon as battery 13 is connected in the circuit, capacitor 24 begins charging through resistors 23, 26 and 27. At this time, transistors 14 and 15 are both off, and point 28 is at ground potential. When point 25 reaches a positive voltage level high enough to forward bias the base-emitter junction of transistor 14 it begins to turn on. Marginal turn on of transistor 14 allows sufficient base current to flow in transistor 15 to saturate it almost immediately. Saturation of transistor 15 brings collector 21 to almost full supply voltage and transmits a positive going pulse to output terminal 40 and simultaneously through capacitor 24 to base 18 of transistor 14 thereby driving it into saturation.

During the pulse, current flows from the left plate of capacitor 24 through resistor 30, diodes 31 and 32, through battery 13 from the negative to the positive terminal and through the emitter-collector circuit of transistor 15 to the right plate of capacitor 24. That current causes capacitor 24 to become charged from — to + proceeding from left to right plates. In addition, as soon as transistor 15 turns on, practically full supply voltage appears across resistors 26 and 27 with a predetermined fraction (preferably ⅓) the voltage drop appearing across resistor 27. Therefore, emitter 17 rises to predetermined fraction of the voltage during the pulse.

As charge current for capacitor 24 flows in the shunt circuit, the voltage at point 25 drops toward ground. When the voltage at point 25 drops to less than the base-emitter voltage drop for transistor 14 above the voltage at emitter 17, transistor 14 turns off, thus removing base current from transistor 15 and turning it off. When transistor 15 cuts off, collector 21 and output terminal 40 drop immediately to ground potential and produce a negative going pulse at output terminal 40, which is transmitted through capacitor 24 to base 18, driving it into hard cut off by driving base 18 to a potential below ground potential.

When transistors 14 and 15 turn off, capacitor 24 discharges and begins to recharge in the opposite direction as current flows from the right plate through resistors 26 and 27, through battery 13 from the negative to the positive terminal and through resistor 23 to the left plate. Capacitor 24 charges in the opposite direction until point 25 reaches a potential sufficient to cause turn on of transistor 14 again.

The repetition rate of the pulse generator is determined by the product of the capacitance of capacitor 24 and the sum of resistances of resistors 23, 26 and 27. Since resistor 23 has a value orders of magnitude greater than those of resistors 26 and 27, its value is the primary controlling factor. The pulse width is determined primarily by the product of the resistance of resistor 30 and the capacitance of capacitor 24. Diodes 31 and 32 have a small effect on the pulse width, so that adding extra diodes increases the pulse length somewhat.

Diodes 31 and 32 also provide temperature compensation, counteracting the temperature sensitivity of the base-emitter junction of transistor 14. Because both transistors 14 and 15 are switched between the saturated and cut off states at times when the voltage at base 18 of transistor 14 is changing rapidly, the switching points are very stable.

One operable example of the circuit of FIGURE 1 utilizes the following components:

Battery 13—5 volts
Resistor 23—3 megohms
Resistor 26—10 K ohms.
Resistor 27—5 K ohms
Resistor 30—5 K ohms
Capacitor 24—0.5 microfarads
Transistor 14—2N2924
Transistor 15—2N3907
Diode 31—1N914
Diode 32—1N914

In the circuit of the above example, the following pulse widths and periods $$\left(\text{period}=\frac{1}{\text{pulse repetition rate}}\right)$$

were obtained for the listed supply voltages:

| Power supply (volts) | Pulse width (milliseconds) | Period (milliseconds) |
|---|---|---|
| 9.0 | 2.45 | 730 |
| 6.0 | 2.40 | 730 |
| 4.0 | 2.30 | 735 |
| 3.0 | 2.35 | 730 |
| 2.0 | 2.30 | 740 |
| 1.4 | 2.20 | 745 |
| 1.2 | 2.20 | 760 |
| 1.0 | 2.30 | 770 |
| 0.9 | 2.40 | 770 |

Figure 2:
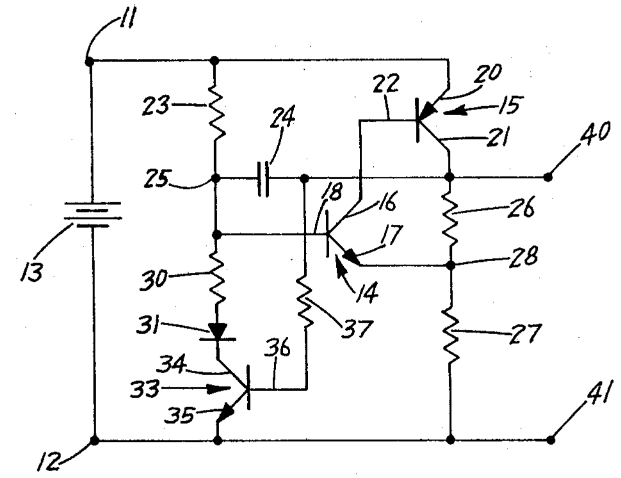
FIG. 2 is a schematic circuit diagram of a modified form of the invention wherein one of the diodes in the bypass circuit is replaced by a transistor.
Figure 3:
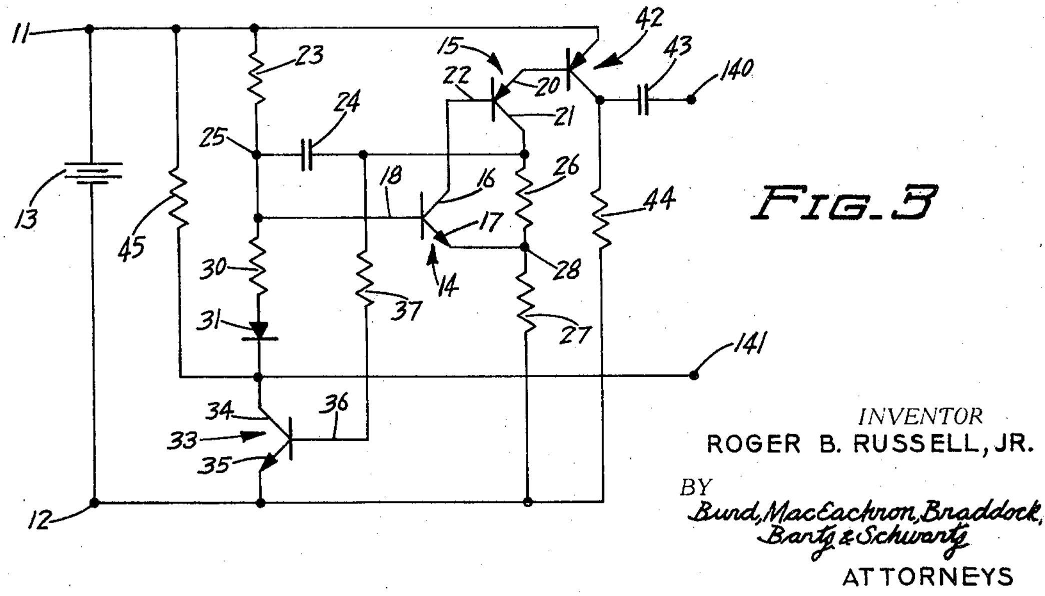
FIG. 3 is a schematic circuit diagram of a further modification of the pulse generator of the invention which incorporates voltage doubling action.

FIGURE 2 discloses a modification of the circuit of FIGURE 1 wherein a transistor 33 is substituted for one of the diodes in the shunt path. Transistor 33 has a pair of current carrying electrodes, here shown as collector 34 and emitter 35, and a control electrode, here shown as base 36. Collector 34 and emitter 35 are serially connected in the shunt circuit between diode 31 and power input terminal 12. Base 36 is connected through a resistor 37 to collector 21 of transistor 15. This transistor functions as a switch which is closed only during the output pulse. The use of transistor 33 in the shunt path is advantageous when the circuit is operated from very low power supply voltages because it eliminates most of the voltage drop required across the diode it replaces. In all respects except those mentioned, the circuit of FIGURE 2 operates like that of FIGURE 1. FIGURE 3 discloses another embodiment incorporating the advantage of the circuit disclosed in FIGURE 2 and adding output voltage increasing circuitry and an output isolation stage. The circuit of FIGURE 3 differs from that of FIGURE 2 in the following respects. Emitter 20 of transistor 15, instead of being connected directly to power input terminal 11, is instead connected to the base of a transsitor 42 whose emitter is connected to power input terminal 11. The collector of transistor 42 is connected through a current limiting resistor 44 to power input terminal 12. The collector of transistor 42 is also connected through an output capacitor 43 to an output terminal 140. Another output terminal 141 is connected directly to the collector 34 of transistor 33. A resistor 45 is connected between power input terminal 11 and collector 34 of transistor 33.

The generation of pulses in the circuit of FIGURE 3 occurs in the same manner as above described with respect to FIGURE 1. Transistor 42 allows the circuit to operate with little effect on pulse width or pulse amplitude even when the load is short circuited. In addition, the output voltage appearing between terminals 140 and 141 is approximately double the supply voltage. This occurs because, between pulses, terminal 141 is at nearly supply voltage and charges output capacitor 43 through the load until its right plate is approximately supply voltage above its left hand plate which is at ground potential. At the onset of each pulse, the collector of transistor 42 goes to approximately supply voltage and collector 34 of transistor 33 goes to ground. That action immediately raises the voltage at the right plate of capacitor 43 and output terminal 140 to nearly twice the supply voltage while the voltage at output terminal 141 drops to approximately ground. Such output voltage doubling is advantageous when operating from a low voltage supply.

Figure 4:
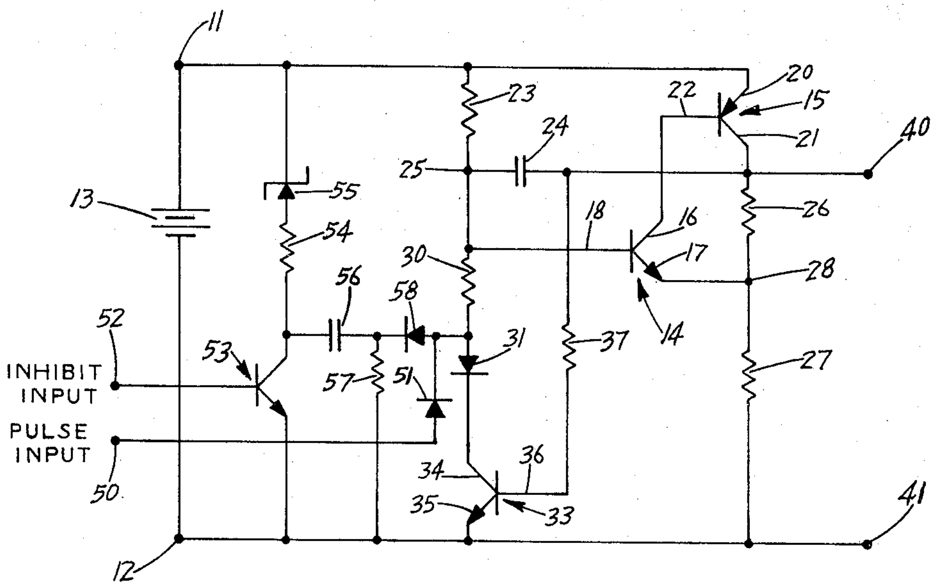
FIG. 4 is a schematic circuit diagram of another form of the pulse generator of the invention which permits the pulse generator to be prematurely fired or inhibited by an external signal input.

FIGURE 4 discloses a circuit in which additional input terminals have been provided for prematurely firing a pulse or for inhibiting a pulse in response to a signal applied to the proper input terminal.

The circuit of FIGURE 4 differs from that of FIGURE 2 in the following resects. A pulse input terminal 50 is connected through a diode 51 to a point intermediate resistor 30 and diode 31. An inhibit input terminal 52 is connected to the base of a transistor 53 whose collector is connected through a current limiting resistor 54 and a Zener diode 55 to power input terminal 11. The emitter of transistor 53 is directly connected to power input terminal 12. The collector of transistor 53 is also connected through a serial combination of a capacitor 56 and a resistor 57 to power input terminal 12. A diode 58 is connected between a point intermediate capacitor 56 and resistor 57 and a point intermediate ressitor 30 and 31.

In operation of the circuit of FIGURE 4, a positive going pulse applied to terminal 50 is transmitted to base 18 of transistor 14 and causes premature turn on of transistors 14 and 15, immediately generating a pulse between terminals 40 and 41. A positive going pulse applied to inhibit input terminal 52 causes recycling of the pulse generator without firing it. If the inhibiting input repeats at a rate faster than the free running rate of the pulse generator, the pulse generator never fires. When transistor 53 is off, capacitor 56 is charged positive to negative from its left to right plates. As transistor 53 turns on with the onset of an inhibit pulse, the right plate of capacitor 56 drops to a potential below ground and, through diode 58, pulls base 18 of transistor 14 to a potential below ground equal to that at which it would be brought at the end of an ordinary pulse. Capacitor 56 is selected to be much larger than timing capacitor 24 so that transfer of charge from capacitor 24 does not appreciably affect the voltage on capacitor 56. The magnitudes of Zener diode 55 and capacitor 56 are appropriately chosen to obtain reset to the proper voltage level.

Figure 5:
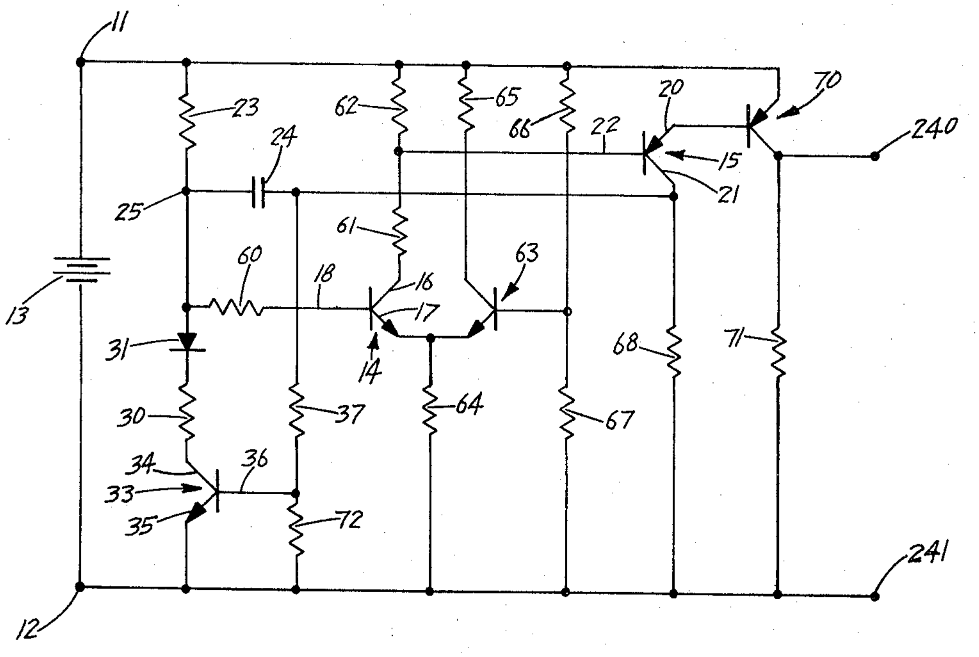
FIG. 5 is a schematic circuit diagram of another form of the pulse generator of the invention which includes a number of additional circuit elements to further improve stability.

FIGURE 5 discloses another embodiment of the invention in which several elements have been added to improve timing stability. A base resistor 60 has been added between point 25 and base 18 of transistor 14. A resistor 61 is connected between collector 16 of transistor 14 and base 22 of transistor 15. Another resistor 62 is connected between base 22 of transistor 15 and power input terminal 11. An emitter follower transistor 63 has its emitter connected through an emitter resistor 64 to power input terminal 12. Collector 17 of transistor 14 is connected to the emitter of transistor 63. The collector of transistor 63 is connected through a collector resistor 65 to power input terminal 11. A voltage divider comprising resistors 66 and 67 is connected between power input terminals 11 and 12. The base of transistor 63 is connected to a point intermediate resistor 66 and 67. A current limitnig resistor 68 is connected between collector 21 of transistor 15 and power input terminal 12. An output isolation transistor 70 has its base connected to emitter 20 of transistor 21, its emitter connected to power input terminal 11, and its collector connected through a current limiting resistor 71 to power input terminal 12. An output terminal 240 is connected to the collector of transistor 70, and an output terminal 241 is connected to power input terminal 12.

Emitter follower transistor 63 has been inserted between timing transistor 14 and the point intermediate resistors 66 and 67 to reduce the source impedance into which emitter 17 of transistor 14 looks. In this circuit, the emitter of transistor 14 is not connected to a variable reference potential as it is in other modifications. In general, the circuit operates in the manner described with respect to FIGURE 2 and is capable of timing stability of the order of 0.1 percent with a 2:1 variation of power supply voltage between 10 and 20 volts.

Figures 6, 8:
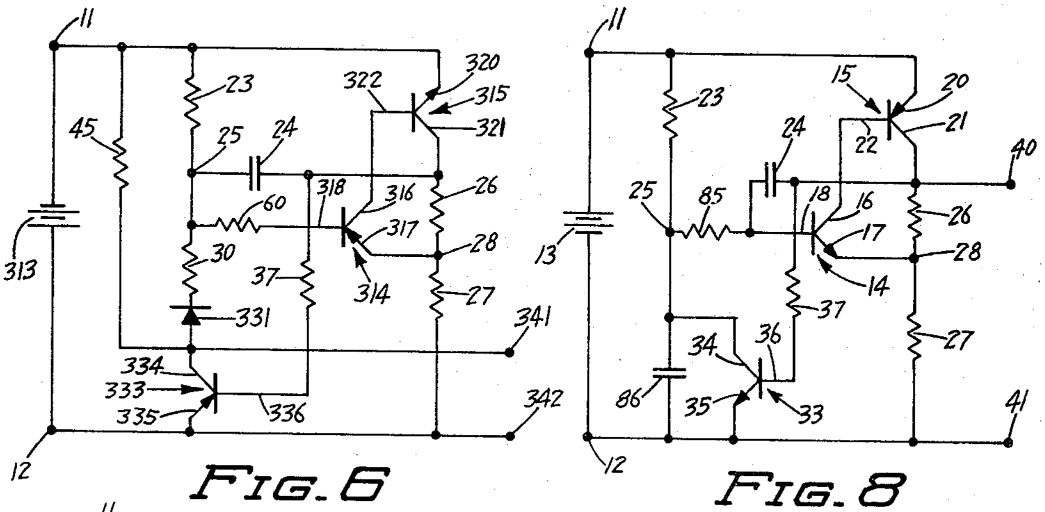
FIG. 6 is a schematic circuit diagram of another embodiment of the invention utilizing transistors of complementary symmetry and providing an output signal from a different point in the circuit.
FIG. 8 is a schematic circuit diagram of still another modification of the pulse generator of the invention using separate timing capacitors for pulse width and repetition rate.

FIGURE 6 discloses an embodiment of the invention similar to that shown in FIGURE 2 except that the transistors are replaced by their complementary types, the diode and battery polarities are reversed, and the output is taken from a different point in the circuit. A first output terminal 341 is connected directly to the collector 334 of a transistor 333, and the second output terminal 342 is connected directly to power input terminal 12. In this modification, a resistor 45 is also connected between power input terminal 11 and collector 334. Except for the current direction changes required by the polarity reversals and use of complementary transistor types, the circuit of FIGURE 6 operates in a manner similar to that of FIGURE 2.

Figure 7:
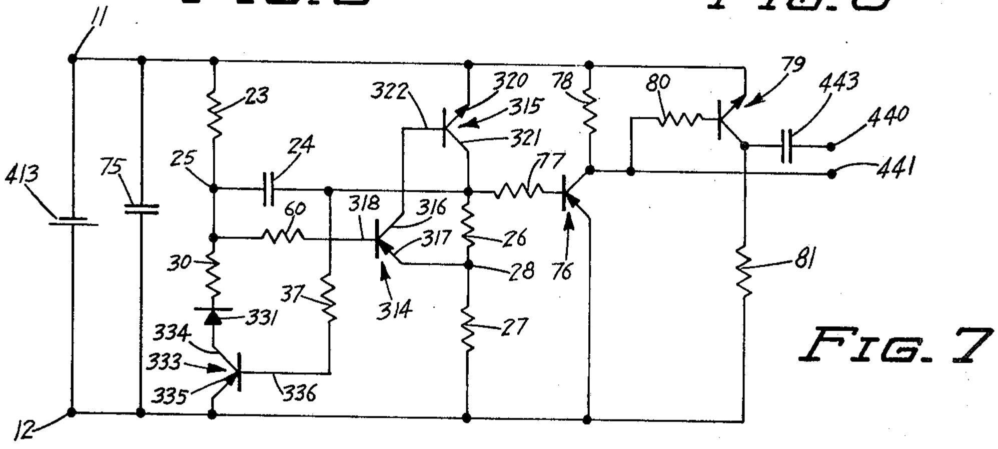
FIG. 7 is a schematic circuit diagram of further modified form of the pulse generator invention designed for operation with a single cell battery and utilizing output voltage doubling action.

FIGURE 7 discloses an embodiment of the pulse generator of the invention which is particularly well adapted to operation from a single 1.4 volt mercury cell. The circuit is similar to that of FIGURE 6 except that an output voltage increasing network and a capacitor across the supply voltage has been added.

In FIGURE 7, a capacitor 75 is connected between power input terminal 11 and power input terminal 12. A single 1.4 volt mercury cell 413 is also connected between power input terminals 11 and 12. A transistor switch 76 has its base connected through a resistor 77 to collector 321 of transistor 315. The collector of transistor 76 is connected through a current limiting resistor 78 to power input terminal 11 and the emitter of transistor 76 is directly connected to power input terminal 12. A further transistor switch 79 has its base connected through a resistor 80 to the collector of transistor 76. The emitter of transistor 79 is directly connected to power input terminal 11, and the collector of transistor 79 is connected through a current limiting, resistor 81 to power input terminal 12. The collector of transistor 79 is also connected through an output capacitor 443 to an output terminal 440. The collector of transistor 76 is directly connected to an output terminal 441. Voltage increasing action occurs in the circuit in a manner similar to that described with respect to FIGURE 3. Capacitor 75 reduces the peak power drain on battery 413, thereby extending battery life.

FIGURE 8 discloses a modification of the pulse generator of the invention in which one capacitor determines pulse width and another determines the repetition rate. The circuit of FIGURE 8 differs from that of FIGURE 2 in the following respects. A resistor 85 is connected between point 25 and the junction of base 18 of transistor 14 and the left plate of capacitor 24. A capacitor 86 is connected in parallel with the collector-emitter circuit of transistor 33 between point 25 and power input terminal 12.

In this configuration, capacitor 24 determines the pulse width, and capacitor 86 determines the repetition rate. This circuit permits reset to a ground reference potential rather than to a negative potential as occurs in the previously described embodiments.

Figure 9:
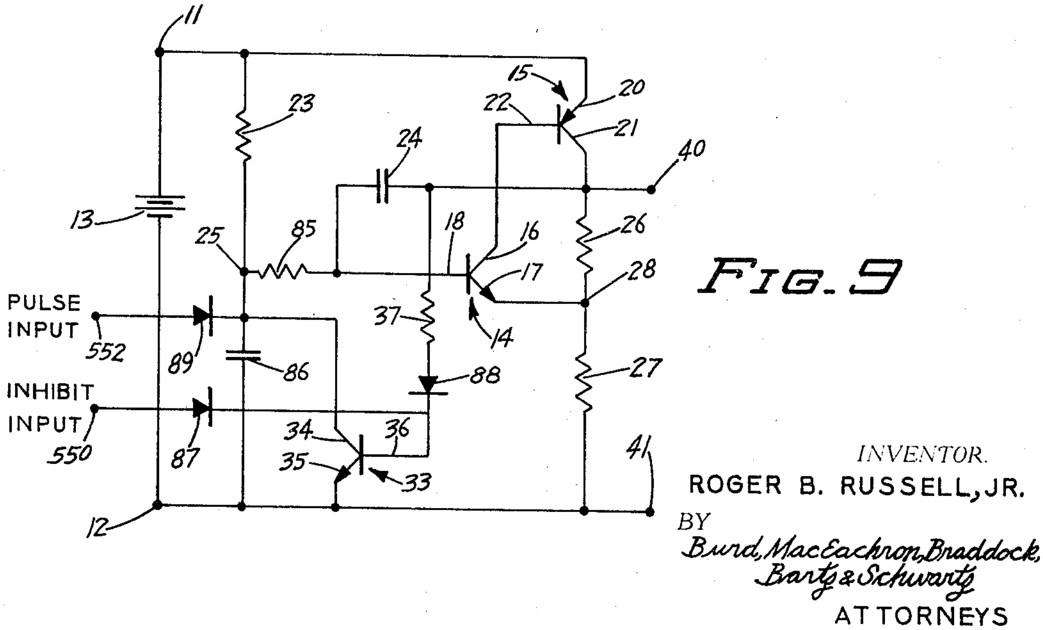
FIG. 9 is a schematic circuit diagram of another embodiment of the pulse generator of the invention permitting premature firing or inhibition of pulses by external signal outputs.

FIGURE 9 is yet another embodiment of the pulse generator of the invention and is similar to FIGURE 8 except that it further incorporates additional inputs for prematurely firing the pulse and for inhibiting the pulse. The circuit of FIGURE 9 differs from that of FIGURE 8 in the following respects. A diode 87 is connected between an inhibiting input terminal 550 and base 36 of transistor 33. A diode 88 is connected between base 36 of transistor 33 and resistor 37. A diode 89 is connected between pulse input terminal 552 and collector 34 of transistor 33.

In the circuit of FIGURE 9, a positive going pulse applied to terminal 552 is transmitted to base 18 of transistor 14 causing immediate firing of transistors 14 and 15 and generating a positive output pulse between output treminals 40 and 41. A positive going pulse applied to inhibit input terminal 550 turns on transistor 33 causing capacitor 24 and 86 to be reset just as if a normal pulse had occurred.

The circuit of FIGURE 9 is advantageous because reset of capacitor 86 is accomplished by the transistor 33 regardless of whether the activating pulse is an inhibit pulse form inhibit input terminal 550 or a normal pulse from output terminal 40. This arrangement permits closer tracking of the pulse period following an inhibit input and that following a normal pulse input than is possible with embodiments where those reset functions derive from different transistors.

It is readily apparent that many other modifications are possible within the scope of the invention. Examples of such obvious modifications are polarity reversals and substitution of complementary transistor types of those shown.

The embodiments of the invention are defined in the claims as follows:

1. A pulse generator comprising:
power input means to be connected to a source of power;
switching means operatively connected to the power input means;
timing means connected to control the switching means; and
bypass means bypassing the switching means and connected to provide a preferred current path for operating the timing means thereby decreasing the effect of switching means characteristics on pulse timing.

2. A pulse generator according to claim 1 wherein the timing means includes a single energy storage device and determines both pulse width and pulse repetition rate.

3. A pulse generator according to claim 1 wherein the bypass means includes an asymmetric current conducting device.

4. A pulse generator according to claim 1 which further comprises:
output voltage increasing means operatively connected to the switching means and to the power input means.

5. A pulse generator according to claim 1 wherein the bypass means includes a semiconductor device.

6. A pulse generator according to claim 5 wherein the semiconductor device is a bipolar transistor.

7. A pulse generator according to claim 1 wherein the switching means comprises at least one semiconductor device; the timing means includes a single capacitor and determines both pulse width and pulse repetition rate; and the bypass means includes a diode.

8. A pulse generator according to claim 7 wherein the bypass means further includes a bipolar transistor having its collector-emitter circuit connected in series with the diode.

9. A pulse generator comprising:
power input means adapted to be connected to a source of power;
switching means connected across the power input means;
timing means connected between the power input means and the switching means to control the switching means; and
shunt means connected between the timing means and the power input means thereby providing a preferred current path for operating the timing means and decreasing the effect of characteristics of the switching means on pulse timing.

10. A pulse generator according to claim 9 wherein:
the power input means comprises first and second power terminals for connection to a source of energy;
the switching means comprises first and second semiconductor switching devices each having first and second current carrying electrodes and a control electrode with the first current carrying electrode of the first device connected to the control electrode of the second device and the first current carrying electrode of the second device connected to the first power terminal and circuit means connecting the second current carrying electrode of the first device and the second current carrying electrode of the second device to the second power terminal;
the timing means includes a serial combination of impedance means and capacitance means connected between the first power terminal and the second current carrying terminal of the second device, the timing means having a point intermediate the impedance means and the capacitance means connected to the control electrode of the first device; and the shunt means includes a serial combination of a second impedance means and asymmetric current conducting means connected between the intermediate point and the timing means and the second power terminal.

11. A pulse generator according to claim 10 wherein the asymmetric current conducting means includes a third semiconductor device having first and second current carrying electrodes serially connected to the second impedance means and a control electrode connected to the second current carrying electrode of the second device.

12. A pulse generator according to claim 11 wherein the circuit means comprises voltage divider means connected between the second current carrying electrode of the second device and the second power terminal and having a point intermediate the ends thereof connected to the second current carrying electrode of the first device.

13. A pulse generator comprising:
power input means adapted to be connected to a source of power;
switching means controllable between first and second states by an applied signal of a magnitude greater than a reference magnitude by a predetermined amount, the switching means being operably connected to the power input means;
timing means for generating a control signal connected in controlling relation to the switching means; and variable reference magnitude determining means operably connected to the switching means to provide a reference magnitude which substantially is independent of the voltage applied across the power input means when the switching means is in the first state, and to provide a reference magnitude which is a function of the voltage applied across the power input means when the switching means is in the second state thereby making pulse timing substantially independent of fluctuations in the voltage of the source of power over a relatively wide range.

14. A pulse generator according to claim 13 which further comprises:
bypass means bypassing the switching means and connected to provide a preferred current path for operating the timing means thereby decreasing the effect of switching means characteristics on pulse timing.

15. A pulse generator according to claim 13 wherein the variable reference magnitude determining means comprises a voltage divider connected so that substantially no voltage appears across a part thereof when the switching means is in the first state and so that a predetermined fraction of the voltage applied across the power input means appears across the part when the switching means is in the second state.

16. A pulse generator according to claim 13 wherein the switching means comprises first and second semiconductor devices each having a pair of current carrying electrodes and a control electrode with one of the current carrying electrodes of the first device connected to the control electrode of the second device so that turn on of the first device causes turn on of the second device and turn off of the first device causes turn off of the second device.

17. A pulse generator according to claim 16 wherein the timing means includes a capacitor whose charge and discharge characteristics control turn on and turn off of the first device, and wherein the variable reference magnitude determining means comprises a voltage divider having first and second parts connected in series with the current carrying electrodes of second device across the power input means, and having a point intermediate the first and second parts connected to the other current carrying electrode of the first device.

References Cited

UNITED STATES PATENTS 3,334,311 8/1967 Kan et al. ____________ 331—111

JOHN KOMINSKI, Primary Examiner